(12) United States Patent
Yamaguchi

(10) Patent No.: US 8,373,059 B2
(45) Date of Patent: Feb. 12, 2013

(54) SOLAR CELL ARRAY AND SOLAR CELL MODULE

(75) Inventor: Hiroshi Yamaguchi, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 168 days.

(21) Appl. No.: 12/185,293

(22) Filed: Aug. 4, 2008

(65) Prior Publication Data

US 2009/0038671 A1     Feb. 12, 2009

(30) Foreign Application Priority Data

Aug. 10, 2007 (JP) .................. 2007-209318

(51) Int. Cl.
 *H02N 6/00* (2006.01)
 *H01L 31/042* (2006.01)
(52) U.S. Cl. ........................................ 136/244
(58) Field of Classification Search ............. 136/244
 See application file for complete search history.

(56) References Cited

U.S. PATENT DOCUMENTS

| | | | | |
|---|---|---|---|---|
| 4,481,378 A | * | 11/1984 | Lesk ............................ | 136/244 |
| 4,638,109 A | | 1/1987 | Ishihara et al. | |
| 5,131,956 A | * | 7/1992 | Oohara et al. ............. | 136/256 |
| 5,866,471 A | | 2/1999 | Beppu et al. | |
| 6,034,322 A | | 3/2000 | Pollard | |
| 6,563,289 B1 | * | 5/2003 | Cross ......................... | 320/101 |
| 6,846,984 B2 | * | 1/2005 | Fath et al. .................... | 136/256 |
| 2001/0023702 A1 | * | 9/2001 | Nakagawa et al. ........... | 136/244 |
| 2003/0029494 A1 | | 2/2003 | Ohkubo | |
| 2006/0180198 A1 | | 8/2006 | Takamoto et al. | |
| 2007/0221919 A1 | | 9/2007 | Sato et al. | |

FOREIGN PATENT DOCUMENTS

| | | |
|---|---|---|
| JP | 60-240171 | 11/1985 |
| JP | 63-275186 | 11/1988 |
| JP | 1-076059 | 5/1989 |
| JP | 7-302923 | 11/1995 |
| JP | 09-181000 | 7/1997 |
| JP | 2006-228900 | 8/2006 |
| JP | 4039949 | 11/2007 |
| WO | WO 02-054501 | 7/2002 |
| WO | WO 2005-112133 | 11/2005 |

* cited by examiner

*Primary Examiner* — Basia Ridley
*Assistant Examiner* — Tamir Ayad
(74) *Attorney, Agent, or Firm* — Nixon & Vanderhye, P.C.

(57) ABSTRACT

A solar cell array is formed by connecting an n-type electrode of a first solar cell included in a plurality of solar cells and a p-type electrode of a second solar cell with each other. An n-type electrode of a protective diode is connected to the p-type electrode of the first solar cell, while a p-type electrode of the protective diode is connected to the p-type electrode of the second solar cell. According to this structure, a solar cell array capable of reducing the number of welded points with respect to bonded portions of the solar cells as well as a process time and a solar cell module including the same can be provided.

18 Claims, 7 Drawing Sheets

SOLAR CELL ARRAY AND SOLAR CELL MODULE

This nonprovisional application is based on Japanese Patent Application No. 2007-209318 filed on Aug. 10, 2007, with the Japan Patent Office, the entire contents of which are hereby incorporated by reference.

BACKGROUND OF THE TECHNOLOGY

1. Field of the Technology

The present technology relates to a solar cell array and a solar cell module employing the solar cell array, and more particularly, it relates to a solar cell array having a protective diode and allowing simple connection between solar cells and a solar cell module employing this solar cell array.

2. Description of the Background Art

FIGS. 9 to 12 show exemplary conventional flexible solar cells. In one of the conventional solar cells, an n-type electrode 52 is formed on the surface of a single-crystalline thin film layer 51, as shown in FIGS. 9 and 10. Single-crystalline thin film layer 51 is formed by epitaxially growing an element layer on a semiconductor substrate and thereafter separating the semiconductor substrate and the epitaxially grown element layer from each other. A metal thin film 53 having a thickness of not more than 100 μm is formed on the lower surface of single-crystalline thin film layer 51 as a holding material for supporting electrode 52 or the semiconductor layer. Single-crystalline thin film layer 51 has a thickness of not more than 50 μm, for example, and includes at least one p-n junction. On metal thin film 53, a p-type electrode pad 54 is formed on the same surface as electrode 52. In order to serially or parallelly electrically connect such solar cells with each other, interconnectors 56 are electrically connected to electrode 52 and electrode pad 54 by parallel gap welding or the like.

This solar cell is abundant in flexibility, due to the extremely thin semiconductor layer. A protective resin film of polyimide or the like may be bonded to the back surface of this solar cell. In order to prepare a solar cell array, a plurality of such solar cells are serially or parallelly connected with each other, a diode serving as a protective element is parallelly connected to the solar cells, and sealed with adhesives such as transparent resin films 57 and silicone resin films 56.

On the other hand, a connecting structure shown in FIGS. 11 and 12 is known as a general technique of connecting a diode to a solar cell in order to protect the device (refer to U.S. Pat. No. 6,034,322, for example). This solar cell is formed on a substrate, and has no flexibility. In the connecting structure shown in FIGS. 11 and 12, a diode 59 in the form of a triangular flat plate is set on a corner 58a provided on a solar cell 58 in order to effectively utilize a circular crystalline substrate. At least one corner of solar cell 58 is partially removed to form a beveled edge, so that diode 59 is set on corner 58a.

In solar cell 58 having built-in diode 59, a diode connector 60 is bonded to a front electrode 61 of solar cell 58 and that of diode 59 by a method such as parallel gap welding or the like respectively, while another diode connector 62 is bonded to a rear electrode 63 of solar cell 58 and that of diode 59 by a method such as parallel gap welding or the like respectively. Thus, solar cell 58 and diode 59 are electrically parallelly connected with each other, so that solar cell 58 can be prevented from breakage even if a reverse voltage is applied to solar cell 58.

Conventional solar cell 58 having built-in protective diode 59 is connected with protective diode 59 by diode connectors 60 and 62 having specific shapes for the connection between solar cell 58 and protective diode 59, and hence the number of bonded points is increased, the time (assembly time) for building protective diode 59 into solar cell 58 is increased, and reliability is reduced. Particularly on the surface of solar cell 58, rectangular front electrode 61 is provided around the outer periphery of solar cell 58, and it is difficult to bond diode 59 by welding or the like in response to the position of front electrode 61, and the assembly time is increased due to the increased number of bonded points.

Further, the front and rear sides of protective diode 59 and solar cell 58 are simultaneously connected with each other by connectors 60 and 62, and hence the process time is disadvantageously increased. If a diode is connected to the back surface of the flexible solar cell with a connector, on the other hand, a step is caused due to connectors provided on both surfaces of the solar cell. Therefore, the solar cell may be broken due to this step, and the process time for handling the solar cell in welding is increased as compared with that for a rigid solar cell formed on a substrate.

SUMMARY OF THE TECHNOLOGY

In order to solve the aforementioned problems, a solar cell array is formed by connecting a plurality of solar cells each including a first electrode, having first polarity, formed on a photoreceiving surface of a semiconductor single-crystalline layer having at least one p-n junction and a second electrode, having second polarity, formed on a surface different from that provided with the first electrode on the side of the photoreceiving surface of the semiconductor single-crystalline layer. The first electrode of a first solar cell included in the plurality of solar cells and the second electrode of a second solar cell are connected with each other by an interconnector. A first electrode, having the first polarity, of a protective diode parallelly connected to the solar cells is connected to the second electrode of the first solar cell, and a second electrode, having the second polarity, of the protective electrode is connected to the second electrode of the second solar cell.

The protective diode may be arranged on corner regions of the solar cells, and an interconnector connecting the protective diode and the solar cells with each other may have the same shape as the upper surface of the protective diode. Further, the first electrode and the second electrode of the protective diode may be formed on one surface. In addition, each of the interconnector connecting the first solar cell and the second solar cell with each other, another interconnector connecting the first solar cell and the protective diode with each other and still another interconnector connecting the second solar cell and the protective diode with each other may have a stress relief portion. The solar cell array can be constituted as a solar cell module.

As hereinabove described, the protective diode is connected to the electrodes of the first and second solar cells in a simple structure. According to this structure, the process time for connecting the solar cells with each other can be reduced, and the yield as well as the reliability of the solar cell array can be improved.

The yield in connection of the solar cells can be improved, the steps of manufacturing the solar cells constituting the solar cell array can be simplified, and the interval between the solar cells can be reduced. Thus, the present technology is widely applicable to the field of a solar cell array and a solar cell module including the solar cell array.

The foregoing and other objects, features, aspects and advantages of the present technology will become more apparent from the following detailed description when taken in conjunction with the accompanying drawings.

DESCRIPTION OF THE PREFERRED EMBODIMENTS

First Embodiment

Figure 1:
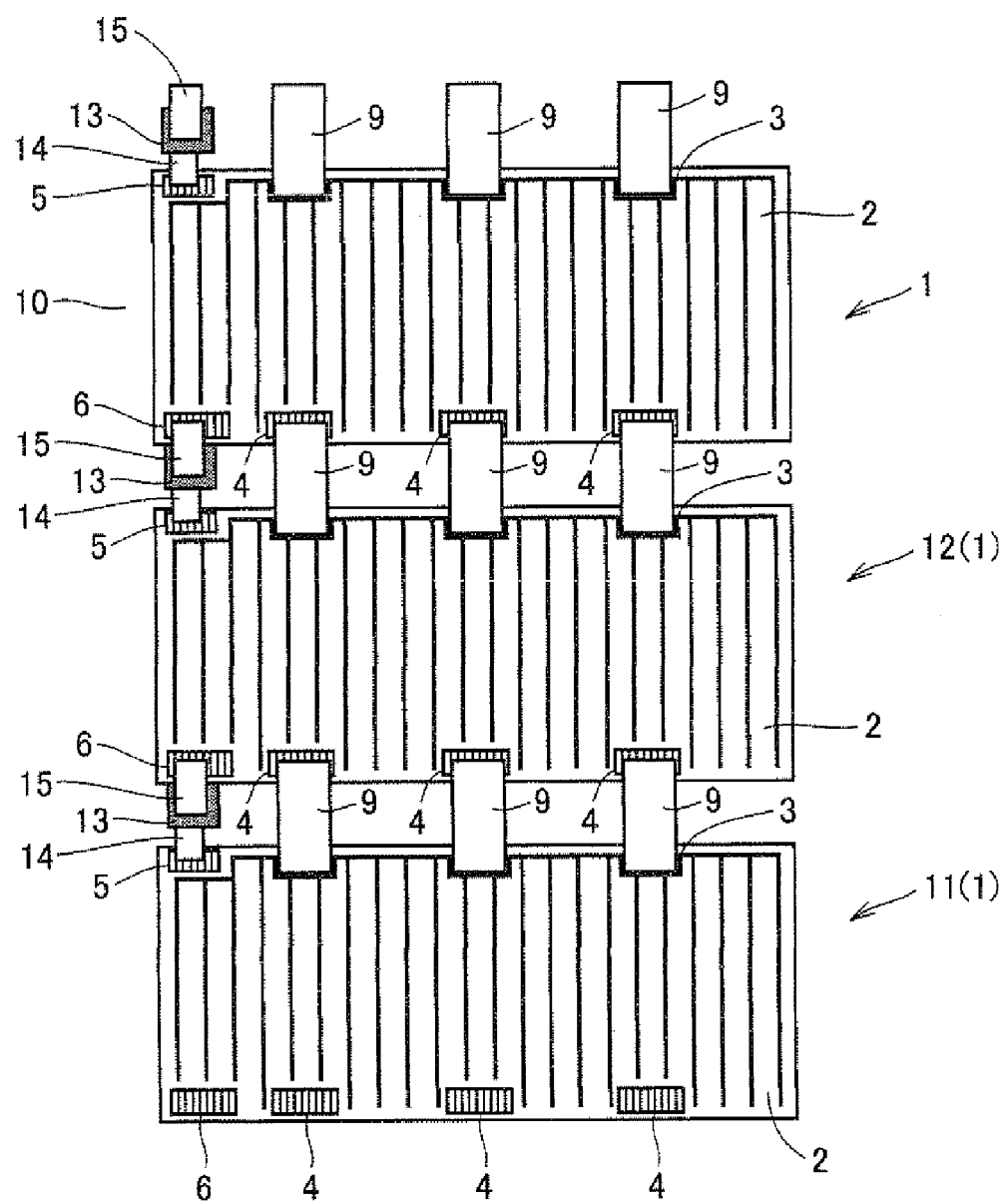
FIG. 1 is a plan view of a solar cell array according to a first embodiment.
Figure 2:
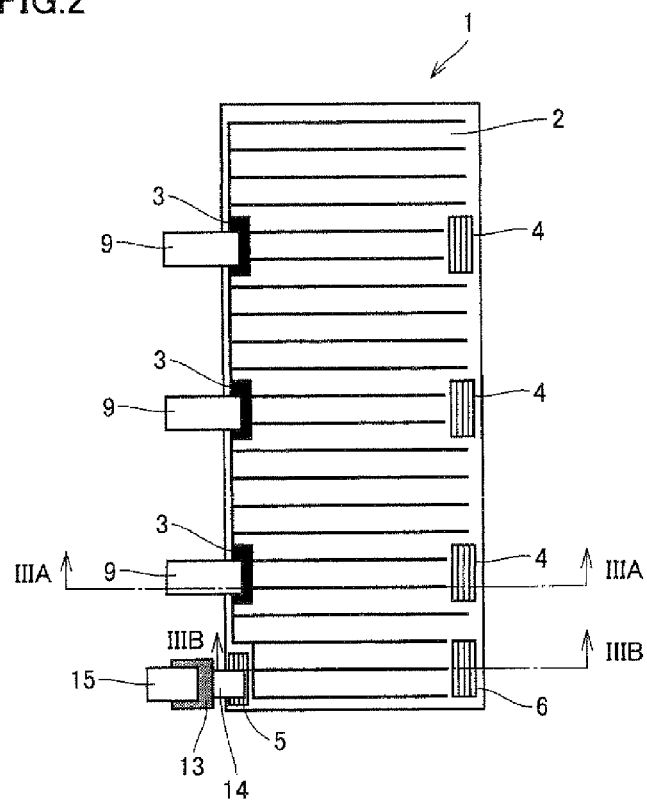
FIG. 2 is a plan view of a solar cell according to the first embodiment.
Figure 3A:
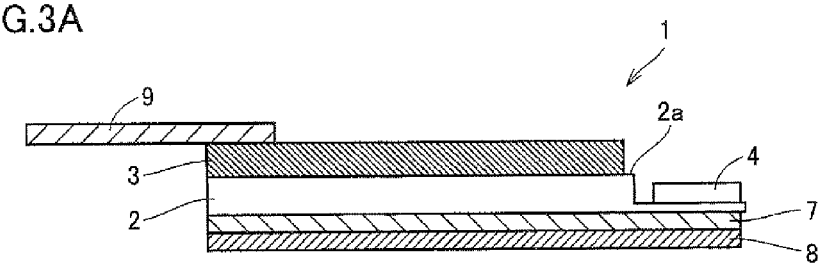
FIGS. 3A and 3B are sectional views of the solar cell according to the first embodiment taken along the lines IIIA-IIIA and IIIB-IIIB in FIG. 2 respectively.
Figure 3B:
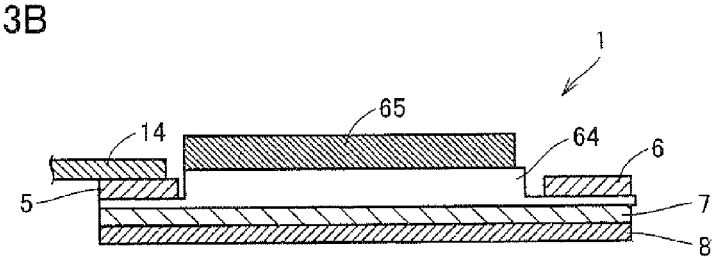

A solar cell array 10 is described with reference to FIGS. 1 to 3. Each solar cell 1 constituting solar cell array 10 according to the first embodiment includes a photoelectric conversion layer 2 having at least one p-n junction and electrode pads 3 provided on the side of a first conductivity type (n-type in this embodiment) semiconductor layer for cell-to-cell connection set on the surface of a first electrode, having the first polarity (n-type in this embodiment), included in photoelectric conversion layer 2, as shown in sectional views of FIGS. 3A and 3B. Photoelectric conversion layer 2 is provided with second electrode pads 4 for cell-to-cell connection set on a second electrode, having second polarity (p-type in this embodiment), positioned on the side opposite to the first conductivity type semiconductor layer and electrode pads 5 and 6 bonded to the second electrode included in photoelectric conversion layer 2 for diode connection. A metal thin film 7 is set on a surface opposite to the surface provided with second electrode pads 4, and a resin film 8 of polyimide or the like is provided on the back surface, if necessary. A plurality of such solar cells 1 are connected with each other by interconnectors 9.

The structure of solar cell array 10 according to this embodiment is now described. Solar cell array 10 is formed by connecting the plurality of solar cells 1 with each other. Each solar cell 1 includes electrode pads 3 connected to the n-type first electrode formed on a photoreceiving surface 2a of photoelectric conversion layer 2 which is a semiconductor single-crystalline layer having at least one p-n junction and second electrode pads 4 connected to the p-type second electrode formed on the surface different from that provided with the first electrode on the side of photoreceiving surface 2a of photoelectric conversion layer 2, as described above. First electrode pads 3 of a first solar cell 11, for example, included in the plurality of solar cells 1 and second electrode pads 4 of a second solar cell 12 are connected with each other by interconnectors 9.

Electrode pads 5 and 6 may be directly connected to the p-type second electrode of photoelectric conversion layer 2 through metal thin film 7, or may be connected to a semiconductor contact layer provided on the second electrode. An n-type first electrode of a protective diode 13 parallelly connected to each solar cell 1 is connected to the second electrode of first solar cell 11 through electrode pad 5, while a p-type second electrode of protective diode 13 is connected to the second electrode of second solar cell 12 through electrode pad 6, with interconnectors 14 and 15 respectively.

According to this connecting structure, the first electrode of protective diode 13 is connected to the second electrode of first solar cell 11 through interconnector 14, electrode pad 5 and metal thin film 7. The second electrode of protective diode 13 is connected to the first electrode of first solar cell 11 through interconnector 15, electrode pad 6 of second solar cell 12, metal thin film 7 of second solar cell 12, and second electrode pads 4, interconnectors 9 and electrode pads 3 of second solar cell 12. Therefore, protective diode 13 is electrically parallelly connected to solar cell 1, and functions as a protective element.

According to this embodiment, not only entire welding is allowed on one surface of solar cell 1 but no welding is required on the first electrode of solar cell 1 in relation to the connection with protective diode 13, whereby solar cell 1 can be prevented from breakage in welding, and the yield in the manufacturing steps can be improved.

Figure 4:
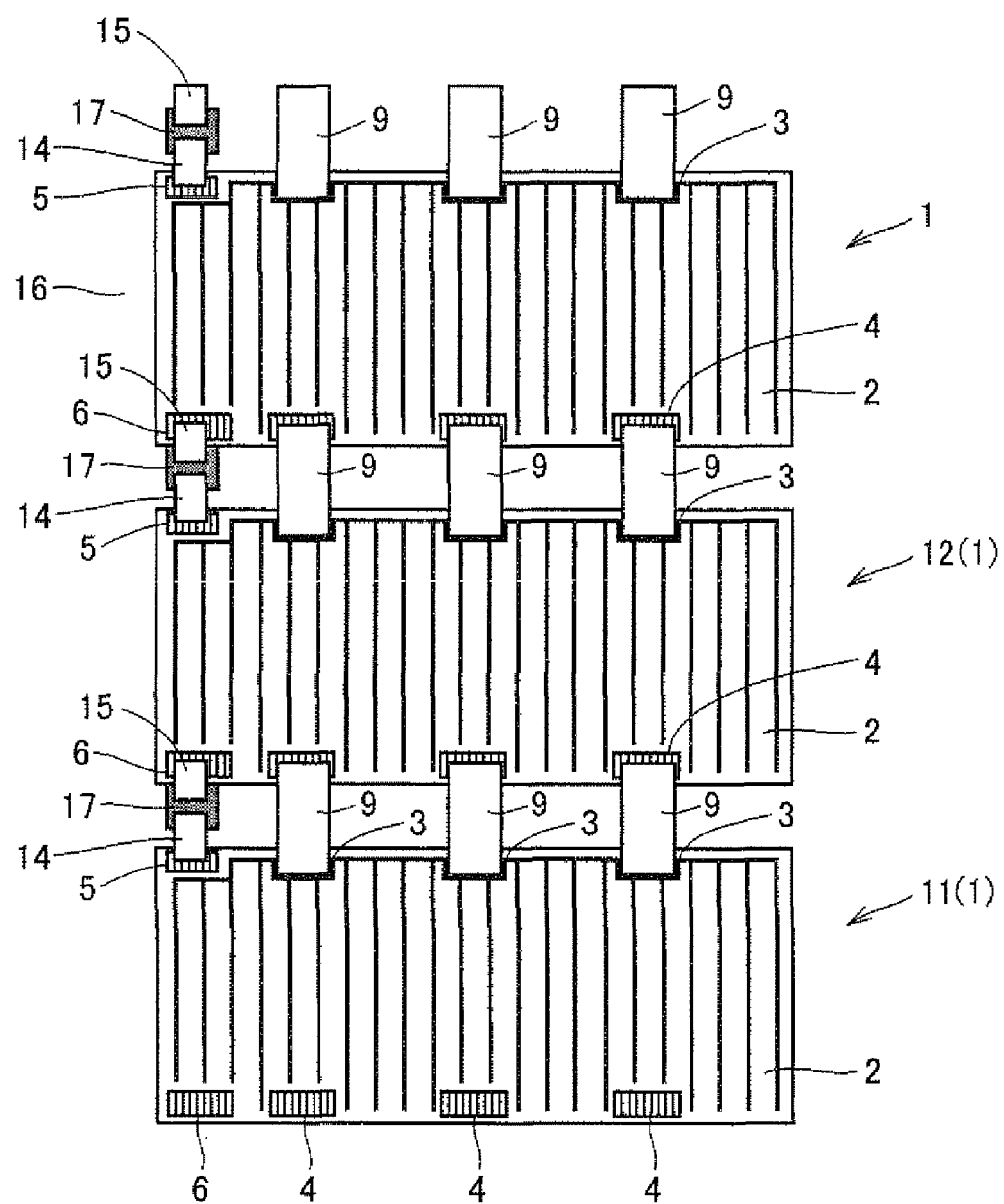
FIG. 4 is a plan view of a solar cell array according to a modification of the first embodiment.

A modification of the first embodiment is now described with reference to FIG. 4. In a solar cell array 16 according to this modification, first and second electrodes of a connected protective diode 17 are formed only on one surface (upper surface, for example). In the process of manufacturing solar cell array 16, connection can be performed from a single surface, and the manufacturing steps can be rationalized.

While the first polarity and the first conductivity type are of the n-type and the second polarity is of the p-type in the first embodiment, functions and effects similar to the above can be attained also when the first polarity and the second polarity are reversed to the p-type and the n-type respectively, as a matter of course.

Second Embodiment

Figure 5:
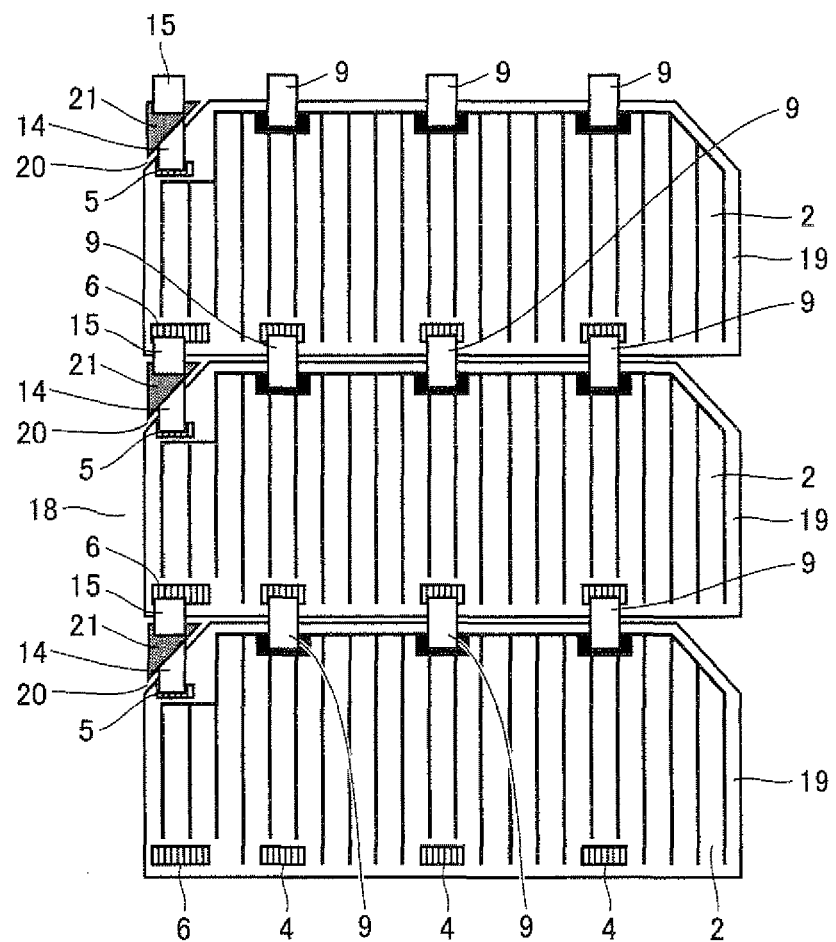
FIG. 5 is a plan view of a solar cell array according to a second embodiment.

A solar cell array 18 according to a second embodiment is described with reference to FIG. 5. Components having the same structures as those in the first embodiment are denoted by the same reference numerals, and redundant description is not repeated. Each solar cell 19 constituting solar cell array 18 according to the second embodiment is substantially in the form of a rectangle having four corners. Solar cell 19 has a beveled edge 20 formed by partially removing at least one of the four corners. A protective diode 21 is arranged adjacently to the corner of solar cell 19 having beveled edge 20.

Figure 6:
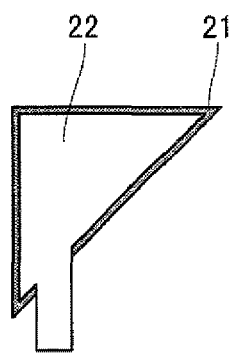
FIG. 6 is an explanatory view of a protective diode according to a modification of the second embodiment.

According to this embodiment, not only the distance between solar cells 19 can be reduced but the area of solar cell array 18 can be reduced as a whole. As a modification of this embodiment, a structure shown in FIG. 6 can be employed. According to this modification, an interconnector 22 connecting protective diode 21 and solar cell 19 with each other has a shape substantially identical to that of the upper surface of protective diode 21.

When protective diode 21 has a p-type electrode and an n-type electrode on first and second surfaces thereof respectively, interconnector 22 connected to the first surface is so formed as to substantially entirely cover the upper surface of protective diode 21, whereby solar cell array 18 is hardly cracked when the same is bent.

Third Embodiment

Figure 7:
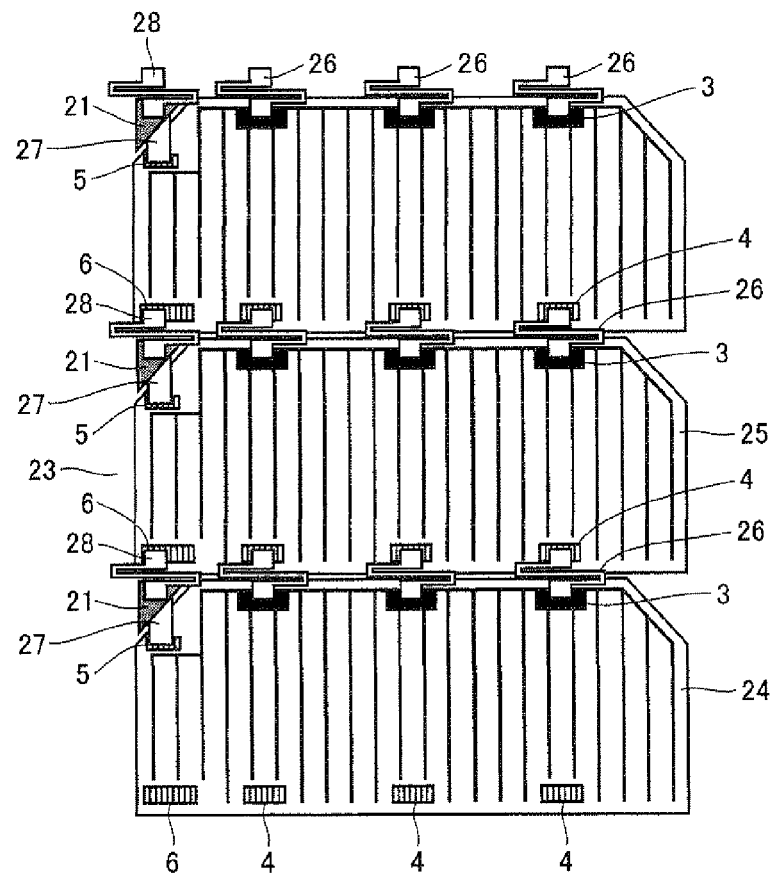
FIG. 7 is a plan view of a solar cell array according to a third embodiment.
Figure 8:
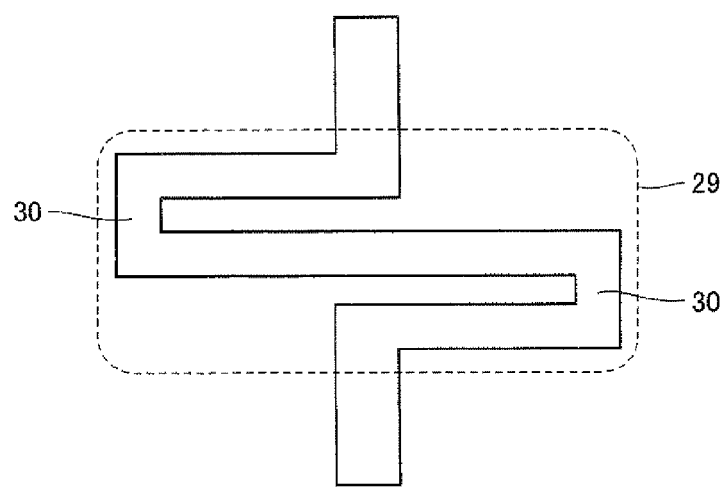
FIG. 8 is a plan view of a stress relief portion of the solar cell array according to the third embodiment.
Figure 9:
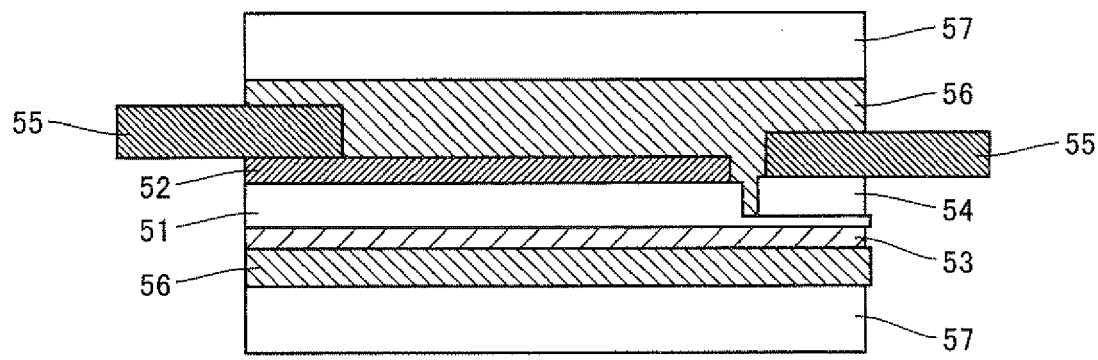
FIG. 9 is a sectional view showing the structure of a conventional solar cell.
Figure 10:
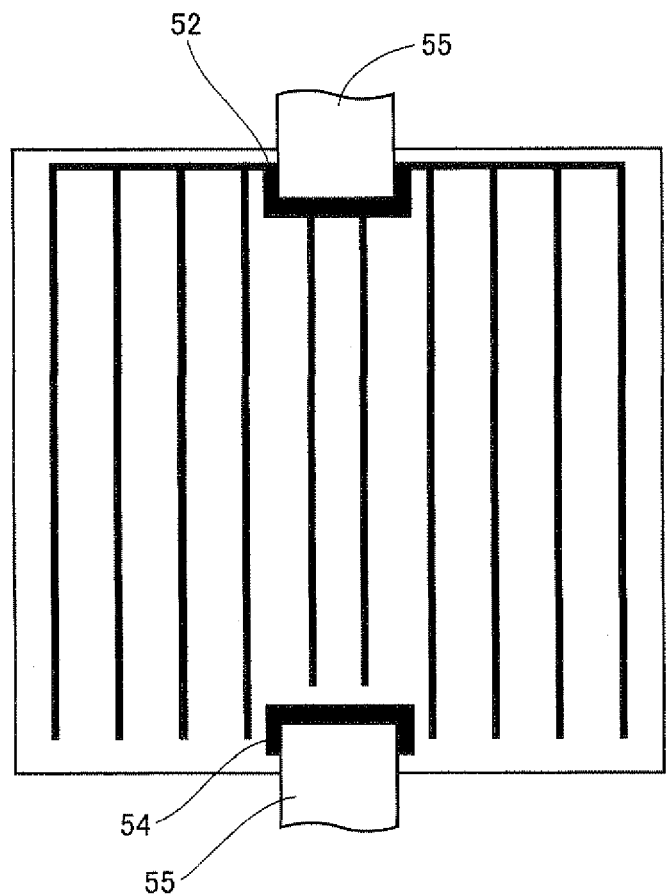
FIG. 10 is a plan view of the conventional solar cell.
Figure 11:
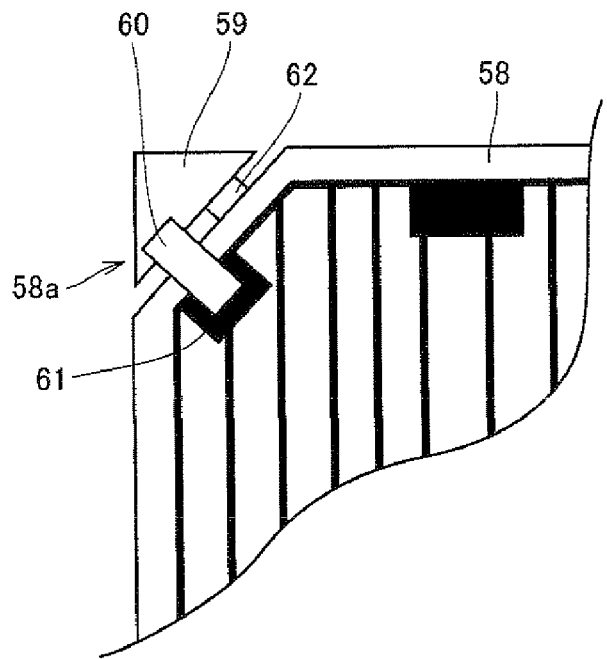
FIG. 11 is a partially fragmented plan view showing the structure of another conventional solar cell.
Figure 12:
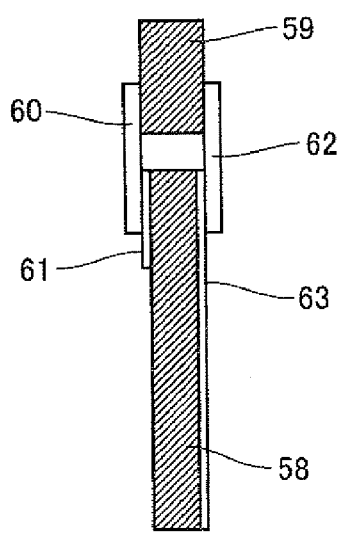
FIG. 12 is a partially fragmented sectional view of the conventional solar cell shown in FIG. 11.

A solar cell array 23 according to a third embodiment is described with reference to FIGS. 7 and 8. Components having the same structures as those in the second embodiment are denoted by the same reference numerals, and redundant description is not repeated. In solar cell array 23 according to the third embodiment, each of interconnectors 26 connecting a first solar cell 24 and a second solar cell 25 with each other, an interconnector 27 connecting first solar cell 24 and a protective diode 21 with each other and an interconnector 28 connecting second solar cell 25 and another protective diode 21 with each other has a stress relief portion 29. In stress relief portion 29, a conductor constituting the corresponding interconnector is not linearly formed but has a bent portion 30, as shown in FIG. 8. Interconenctors 26, 27 and 28 having such stress relief portions 29 are so employed that solar cell array 23 can be protected against thermal stress, and solar cell array 23 as well as a solar cell module employing solar cell array 23 can be improved in reliability.

Although the present technology has been described and illustrated in detail, it is clearly understood that the same is by way of illustration and example only and is not to be taken by way of limitation, the scope of the present technology being interpreted by the terms of the appended claims.

What is claimed is:

1. A solar cell array formed by connecting a plurality of solar cells, each solar cell including a first electrode of a first conductivity type formed on a photoreceiving surface of the solar cell, each solar cell including a semiconductor single-crystalline layer having at least one p-n junction, each solar cell also including a plurality of second electrodes of a second conductivity type that are also formed on the photoreceiving side of the solar cell, wherein
a first electrode of a first solar cell of the array and a second electrode of a second adjacent solar cell of the array are connected with each other by an interconnector, and
wherein a protective diode is electrically connected between the first and second solar cells such that a first electrode of the first conductivity type of the protective diode is electrically connected to one of said plurality of second electrodes of said first solar cell by an interconnector, and a second electrode of the second conductivity type of said protective diode is electrically connected to one of said plurality of second electrodes of said second solar cell by an interconnector, wherein a rear of the first solar cell is adjacent the front of the second solar cell, and wherein the semiconductor layer of each solar cell is patterned such that along at least one side edge of the solar cell, the semiconductor layer includes recessed portions at both the front and rear of the solar cell, wherein at least one of the second electrodes of each solar cell is formed on the recessed portion of the semiconductor layer located at the front of the solar cell, and wherein the first electrode of each solar cell is formed on a top, non-recessed portion of the semiconductor layer at the rear of the solar cell.

2. The solar cell array according to claim 1, wherein said protective diode is arranged at a corner of said first solar cell.

3. The solar cell array according to claim 1, wherein the portions of the interconnectors that are coupled to the first and second electrodes of the protective diode have a shape that matches a shape of the upper surface of said protective diode.

4. The solar cell array according to claim 1, wherein said first electrode and said second electrode of said protective diode are formed on one surface.

5. The solar cell array according to claim 1, wherein said interconnector connecting said first solar cell and said second solar cell with each other, and the interconnectors connecting said protective diode with the first and second solar cells each have a stress relief portion.

6. A solar cell module comprising the solar cell array according to claim 1.

7. The solar cell array according to claim 3, wherein an upper surface of the protective diode is triangular in shape.

8. The solar cell array according to claim 1, wherein the first conductivity type is p-type and the second conductivity type is n-type.

9. The solar cell array according to claim 1, wherein the first conductivity type is n-type and the second conductivity type is p-type.

10. The solar cell array according to claim 1, wherein all of the second electrodes of each solar cell are electrically coupled to one another.

11. The solar cell array according to claim 1, wherein all of the second electrodes of each solar cell are coupled to the same side of a P-N junction formed in the semiconductor layer.

12. The solar cell array according to claim 1, wherein at least one of the second electrodes of each solar cell is formed on the recessed portion of the semiconductor layer located at the rear of the solar cell.

13. The solar cell array according to claim 12, wherein the at least one second electrode formed on the recessed portion of the semiconductor layer located at the rear of the solar cell and the first electrode of each solar cell are aligned with one another on the rear of the solar cell.

14. The solar cell array according to claim 12, wherein the at least one second electrode formed on the recessed portion of the semiconductor layer located at the rear of the solar cell and the first electrode of each solar cell are located at substantially the same distance from a rear edge of the solar cell.

15. The solar cell array according to claim 12, wherein the recessed portion of the semiconductor layer located at the front of each solar cell extends along substantially the entire length of the front edge of the solar cell.

16. The solar cell array according to claim 15, wherein the recessed portion of the semiconductor layer located at the rear of each solar cell extends along only a portion of one side of the rear edge.

17. The solar cell array according to claim 16, wherein a triangular-shaped void is formed at a corner of each solar cell located adjacent the at least one second electrode formed on the recessed portion of the semiconductor layer located at the rear of the solar cell, and wherein the protective diode is located, at least in part, in the triangular-shaped void.

18. The solar cell array according to claim 17, wherein the protective diode is triangular in shape.

* * * * *